United States Patent [19]

Friedman et al.

[11] 4,233,337

[45] Nov. 11, 1980

[54] METHOD FOR FORMING SEMICONDUCTOR CONTACTS

[75] Inventors: Jules D. Friedman, Mahopac; Lumdas H. Saraf, Fishkill, both of N.Y.

[73] Assignee: International Business Machines Corporation, Armonk, N.Y.

[21] Appl. No.: 901,902

[22] Filed: May 1, 1978

[51] Int. Cl.$^2$ .................... H01L 29/48; H01L 21/441
[52] U.S. Cl. ........................ 427/84; 148/1.5; 156/653; 156/657; 427/89; 427/93
[58] Field of Search .............. 427/84, 88, 89, 259; 156/657, 653; 148/1.5

[56] References Cited

U.S. PATENT DOCUMENTS

| | | | |
|---|---|---|---|
| 3,904,454 | 9/1975 | Magdo et al. | 148/187 |
| 3,995,301 | 11/1976 | Magdo | 357/15 |
| 4,018,627 | 4/1977 | Polata | 148/187 |

OTHER PUBLICATIONS

Berger et al., "Masking Process for Base and Isolation Diffusion", IBM Tech. Dis. Bulletin, vol. 14, No. 5, Oct. 1971.
Barile et al., "Implanted Emitter Process for Semiconductor Transistor", IBM Tech. Disclosure Bulletin, vol. 18, No. 7, Dec. 1975.

*Primary Examiner*—John D. Smith
*Attorney, Agent, or Firm*—David M. Bunnell

[57] ABSTRACT

A method for selectively depositing contacts in semiconductor regions. One set of contact openings is protected by a barrier layer during the metallization of another set of exposed contact openings to improve the cleanliness and reliability of the contacts. The barrier layer is then removed and a second layer of metallization is deposited in both sets of openings. In the preferred embodiment a standard diffusion mask is used to define all contact regions and a screen oxide is thermally grown in each of the contact openings. A blocking photoresist mask is then applied and patterned to expose the oxide in those openings in which a first set of contacts is to be formed. The screen oxide is removed and the first layer of metallization, typically platinum silicide, is then formed. The screen oxide is then removed from the protected contact areas and the second layer of metallization, for example, chrome, aluminum, or other metals or combinations thereof are deposited in all openings, thereby forming one layer of metallurgy in the second set of openings and two layers in the first set.

10 Claims, 6 Drawing Figures

METHOD FOR FORMING SEMICONDUCTOR CONTACTS

CROSS REFERENCE TO CO-PENDING APPLICATIONS

This application is related to the application by H. M. Dalal et al, Ser. No. 827,912, filed Aug. 26, 1977, now U.S. Pat. No. 4,155,778 and assigned to the same assignee as the present application.

This application is also related to the application of I. Antipov, Ser. No. 865,813, filed Dec. 30, 1977 and assigned to the same assignee as the present application.

BACKGROUND OF THE INVENTION

1. Field of the Invention

The present invention relates to methods for forming conductive contacts to semiconductors.

2. Description of the Prior Art

The technological development of micro-miniaturized semiconductor integrated circuit devices has required improved methods for making conductive contacts to the semiconductor impurity regions. This has been made possible by newly developed lithographic techniques, improved material deposition processes and metallurgical systems. In particular new combinations of metals have been developed for providing both ohmic as well as Schottky barrier contacts to the impurity regions. Such contacts and the methods for depositing same are described, for example, in U.S. Pat. No. 3,995,310 as well as the above-referenced patent application of Dalal et al. In general, advanced semiconductor integrated circuits require three types of contacts which are made to the impurity regions: ohmic, low-barrier-height Schottky barriers (LSB) and high-barrier-height Schottky barriers (HSB). As discussed in the Dalal et al application, and U.S. Pat. No. 3,995,301 there have been problems in selecting the correct metallurgical systems which will yield satisfactory contacts from the standpoint of switching speed, contact resistance and voltage drops.

Another problem in the formation of said contacts is the development of an optimum technique for selectively depositing a particular type of contact in one or more similar regions of the semiconductor substrate and depositing other types of contacts in other related regions.

A widely used metallurgy for providing both ohmic contacts as well as Schottky barrier contacts is a layer of a metallic silicide, typically platinum silicide, making direct contact with the silicon substrate. The reason for this is that the aluminum makes less than satisfactory contact with silicon. Deposited atop the platinum silicide may be a variety of metals, such as aluminum, chrome, gold, etc. When the platinum silicide is formed of an impurity region having a relatively low doping, a Schottky barrier diode is formed, while formation of the platinum silicide onto a high impurity concentration substrate results in an ohmic contact.

As pointed out in U.S. Pat. No. 3,995,301 platinum silicide Schottky barrier contacts have a relatively high forward barrier of around 0.8 volts. For this reason the switching speed is relatively low. It has therefore been necessary for the art to develop other metallurgical systems for forming low barrier height Schottky barrier (LSB) contacts.

One successful metallurgical system is described in the above-referenced patent application of Dalal et al. The LSB diode is formed by the deposition of tantalum under carefully controlled conditions atop an N− doped silicon semiconductor region. The HSB diode and ohmic contacts are formed first by forming platinum silicide in other N− doped and N+ doped regions, respectively. This is followed by the deposition of tantalum atop the platinum silicide.

In the process of depositing these separate layers of metals in order to form different types of semiconductor contacts, the platinum is deposited into the openings atop the substrate where the ohmic and HSB contacts are to be formed. The openings where the LSB are to be formed are protected by a diffusion mask such as silicon dioxide. After the platinum is deposited and sintered to form platinum silicide the entire substrate, with the exception of the LSB contact openings, is blocked off, typically with a photoresist mask. The diffusion mask is then etched away in the LSB contact openings. Then the photoresist mask is removed. This leaves all openings on the substrate exposed and the tantalum is then deposited in all of the openings.

This process, although resulting in satisfactory contacts, is not as reliable as desired. In the first place the deposition of the separate metallurgical systems requires the added photoresist masking step. Secondly, the layer of photoresist is deposited directly atop the platinum silicide layers. In the usual course of applying, exposing and developing the resist layer, it must be postbaked to drive out the resist solvents. This results in a tough layer which tends to adhere to the platinum silicide. Removal of the resist is quite difficult and also has been found to leave undesirable contaminants atop the platinum silicide layer.

SUMMARY OF THE INVENTION

It is, therefore, a primary object of our invention to improve the method for selectively forming different types of semiconductor contacts which require different combinations of conductive films.

It is another object of our invention to reduce the number of process steps and masks when forming such semiconductor contacts.

It is yet another object of our invention to reduce the amount of contamination caused by the standard photoresist techniques when forming said semiconductor contacts.

These and other objects of our invention are achieved by a novel method of selectively depositing contacts atop regions in a semiconductor substrate. Basically, our technique utilizes a barrier oxide layer as a mask over one set of contact openings while metallization is deposited atop a second exposed set of contact openings. The barrier layer improves the cleanliness and reliability of the first set of contacts.

In the preferred process a diffusion mask is used to define all contact regions. The screen oxide is thermally grown or chemically-vapor-deposited in each of the contact areas. A blocking photoresist mask is then applied and patterned to expose the screen oxide over those regions in which the first set of contacts is to be formed. The first metallization layer, typically platinum silicide, is then formed. The screen oxide is then removed from the protected contact areas and the second metallization layer, for example, aluminum, chrome, tantalum, titanium-tungsten etc. is deposited in all openings. This results in the formation of one layer of metallurgy in the second set of openings and two layers in the first set.

In the preferred embodiments of our invention, those regions contacted only by the one layer metallurgy comprise low-barrier-height Schottky barrier (LSB) diodes while the openings having two layers of metallurgy deposited thereon comprise either ohmic contacts or high-barrier-height Schottky barrier (HSB) diodes.

Our novel process is extendable to systems requiring more than two such layers of metallurgy, as for example, where through separate metallurgical systems are needed.

DETAILED DESCRIPTION OF THE PREFERRED EMBODIMENT

As used in this specification, the term layer means a material or materials which are deposited or applied without a change in masks. Thus, a conductive layer or thin film may include more than one material; for example, a layer may be a composite of one or more metals such as aluminum-chrome, chrome-tantalum, aluminum-chrome-tantalum and so forth.

Figure 1:
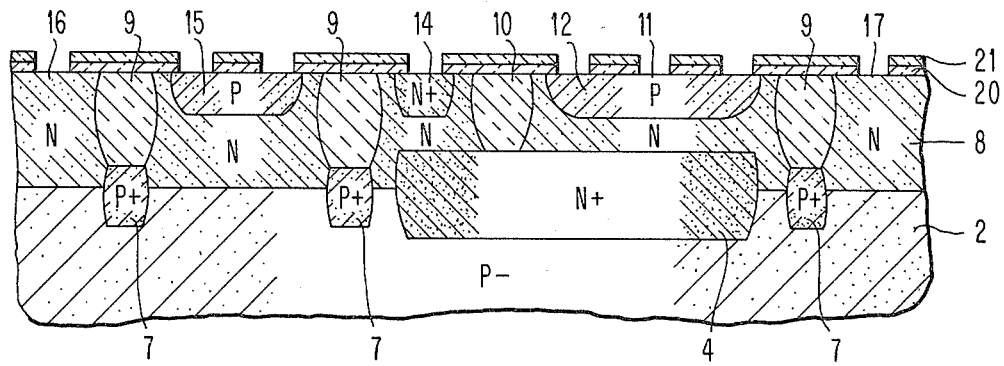
FIGS. 1-6 are fragmentary, sectional views of a semiconductor device incorporating our invention during various stages of fabrication.

FIG. 1 illustrates a partially-completed integrated circuit which includes epitaxial layer 8 of N-conductivity type which has been deposited atop P-substrate 2. Subcollector region 4 and P+ isolation region 7 have outdiffused into epitaxial layer 8. Preferably, layer 8 has a thickness of around 2 microns or less and a impurity concentration of from 2.1 to $2.3 \times 10^{16}$ atoms per cm$^3$. Substrate 2 typically has a resistivity of 10 ohm cm. Regions 4 and 7 are advantageously formed by the standard process of diffusing said regions into windows in a masking layer which expose portions of the bare substrate 2. Typical N+ impurities are arsenic or phosphorus; a typical P+ impurity is boron.

The masking layer is then stripped from substrate 2 by conventional etching techniques and layer 8 is grown epitaxially, thereby causing regions 4 and 7 to outdiffuse into layer 8.

Epitaxial layer 8 also includes recessed oxide isolation regions 9 and 10 which separate the various regions of the devices to be formed within layer 8. These include a P type resistor 15, an N+ subcollector reachthrough region 14, and a P type base region 12. Another isolation region 10 separates collector reachthrough region 14 from base region 12.

Isolation regions 9 and 10 are formed by etching trenches into epitaxial layer 8. An appropriate mask such as a composite of silicon dioxide/silicon nitride covers the remainder of the substrate wherein the trenches are not to be formed. The trenches are then etched either by wet chemical etching techniques or by reactive ion etching. The trenches are then filled with silicon dioxide in the known manner using dry oxygen or a combination of steam and oxygen or both. Alternatively, silicon dioxide could be deposited in the trenches rather than thermally grown. The N+ reachthrough region 14 is then formed by appropriate masking techniques, followed by the formation of resistor region 15 and base region 12.

What has been described heretofore is by now well known to those of skill in the semiconductor design art. Moreover, those of skill in the art will be aware of various alternatives to the processes for fabricating the various impurity regions within the semiconductor substrate. For example, the base region 11 and resistor region 15 could be formed either by diffusion or ion implantation techniques. Other techniques of forming isolation regions are also known. Furthermore, the preferred technique for forming the base region 11 and resistor region 15 as taught in the above-referenced copending application of Antipov is quite advantageous. However, these aforementioned steps are illustrated as merely representing the best mode of practicing our invention. The structure in FIG. 1 and the processes involved in fabricating it form no part of our invention in any case.

Returning now to FIG. 1 our novel process proceeds with the formation of a diffusion mask comprising a thermally grown oxide layer 20 and a chemically vapor deposited silicon nitride layer 21. Openings are shown as having been formed in this composite masking layer for the purpose of making conductive contact to the various selected regions within epitaxial layer 8.

An opening is made atop region 17 in which is to be formed a HSB diode typically having a barrier height of around 0.8 volts. An opening is formed atop P type base region 12 for the formation of an emitter region. A pair of openings adjacent each side of emitter region 11 are provided for the base ohmic contacts. Openings are also provided for ohmic contacts to N+ reachthrough region 14 and P type resistor region 15.

The final opening in this fragmentary section of the semiconductor is over region 16 in which is to be formed a LSB diode, having a barrier height of 0.5 volts or thereabouts. It will be understood by those of skill in the art that many thousands of diodes and other semiconductor devices such as transistors, resistors etc., ordinarily are contained within the same semiconductor chip. In addition, it will be evident to those of skill in the art that not all of the regions illustrated in the drawing are necessary for an operative embodiment of our invention. They are illustrated as representing the best mode of practicing it.

Figure 2:
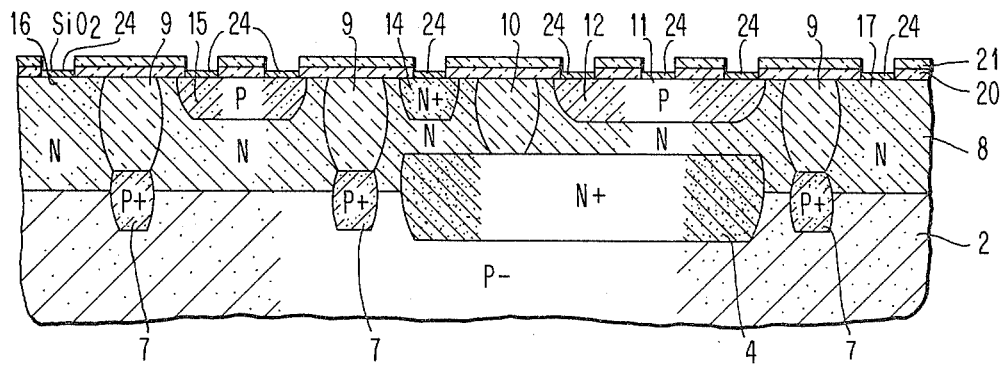
Figure 3:
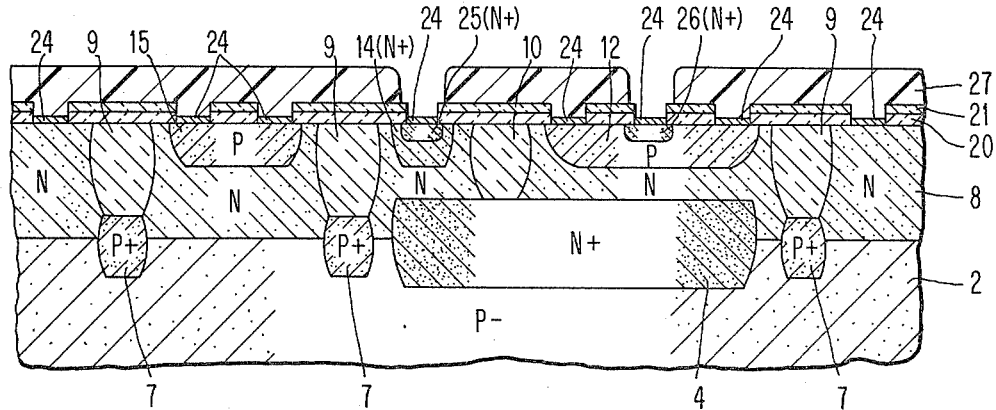

Turning now to FIG. 2 of the drawing, a screen oxide layer 24 is grown or deposited in each of the previously described openings in composite masking layer 20/21. The screen oxide 24 is preferably thermally grown from epitaxial layer 8 in dry oxygen at 1,000° C. or so for 30 minutes to a thickness of 250A. We have found that this thickness is sufficient to protect against contamination during the subsequent processes but is also sufficiently thin to be easily removed to dip etching. As an alternative to thermal growth, the oxide layer 24 could also be formed by conventional chemical vapor deposition techniques. For example, a silicon dioxide layer may be deposited pyrolytically in a chamber containing silane, carbon dioxide and hydrogen at a temperature of around 1,000° C. for around two minutes. Thereafter, by reference to FIG. 3 the usual lithography techniques are used to form a resist mask 27 to delineate the emitter and subcollector reachthrough regions only in the substrate. Generally speaking, blocking mask 27 is used to expose all N type regions in the substrate. At this stage the N+ emitter 26 and an enhanced N+ region 25 in reachthrough region 14 are formed, preferably by the ion implantation of arsenic or phosphorus through the screen oxide 24.

Alternatively, the formation of regions 25 and 26 could be accomplished after oxide 24 is etched away in the exposed regions, typically using buffered hydrofluoric acid. The regions would then be formed either by ion implantation directly into the substrate or by conventional diffusion techniques. After the step of forming regions 25 and 26, blocking mask 27 is stripped by ashing in a plasma etching chamber with oxygen or by wet stripping.

Figure 4:
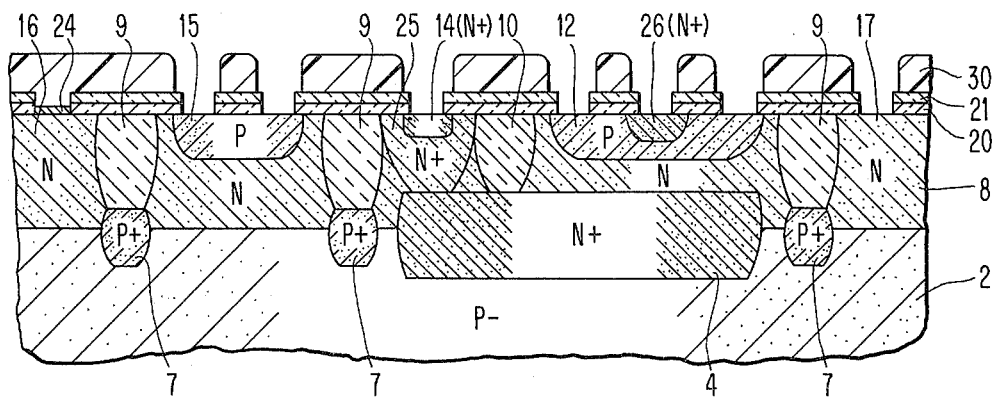

After driving in the emitter 26 and enhanced reachthrough region 25, a second blocking mask 30 is deposited, exposed and developed to expose all impurity regions within the substrate with the exception of region 16 as shown in FIG. 4. Region 16 is reserved for the LSB diode contact which is to be formed in a later step. The exposure of said regions entails removal of screen oxide layer 24 from each of the opening after the development of resist layer 30. Thus, resist layer 30 never makes contacts to any of the regions within the epitaxial layer because of screen oxide 24.

The oxide is then removed by dip etching the entire substrate into buffered HF, an etchant which does not attack resist layer 30 in any substantial way. Dry etching might also be used. Layer 24 over LSB region 16 is protected from the etchant by resist layer 30.

Resist layer 30 is then stripped by conventional means, preferably by the method mentioned above with respect to layer 27. This leaves all of the impurity regions exposed with the exception of region 16, which is protected by the remaining portion of screen oxide layer 24.

Figure 5:
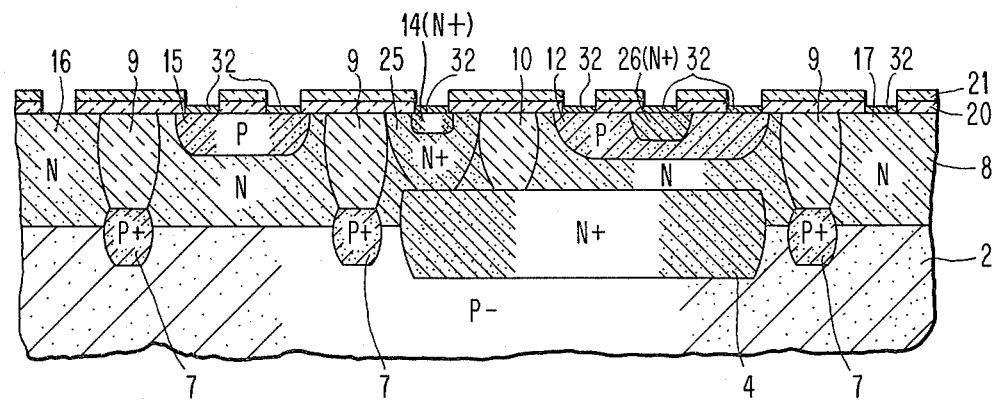

Turning now to FIG. 5, a platinum layer 32 is then deposited in blanket fashion atop layer 21 and within all windows with the exception of the window over region 16 which is protected by screen oxide layer 24. Preferably, the platinum is deposited to a thickness of around 400A by evaporation or sputtering. The wafer is then sintered at around 550° C. for 20 minutes in a nitrogen ambient to cause the platinum to react with the silicon to form platinum silicide 32. The unreacted platinum, including that which is atop nitride layer 21, is then removed by etching, typically in aqua regia. As in known of those of skill in the art, other metals, such as palladium, nickel or hafnium could replace platinum.

In the next step of the process that portion of screen layer 24 which is disposed atop region 16 is removed, preferably by dip etching, to expose the LSB diode region 16. There is no need to protect platinum silicide contacts 32 as they are unaffected by buffered HF.

Figure 6:
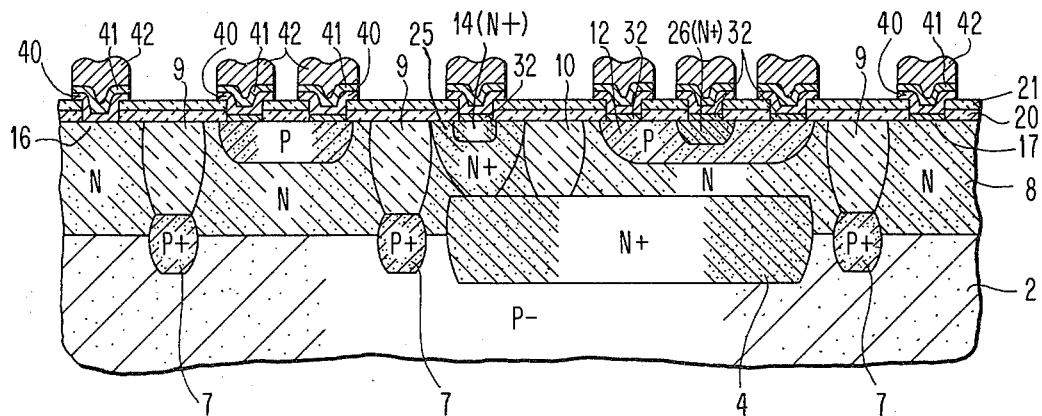

The remainder of the metallurgy system is then deposited into all of the windows in composite masking layer 20/21 as shown in FIG. 6. The preferred process includes the lift-off technique described in U.S. Pat. No. 4,004,044, which issued in the names of Franko et al and is assigned to the same assignee as the present application. The process is also described in the above-referenced application of Dalal et al and will not be repeated in detail in this application. Alternative techniques for forming the metallurgy include standard wet or reactive ion (plasma) subtractive etching processes which are well known to those of skill in the art. However, the lift-off technique is capable of providing superior definition of metallurgy, thereby minimizing the area required for wiring.

Region 17 is a HSB diode contact; region 16 is a LSB diode contact; and the other regions on which the metallurgy is deposited are ohmic contacts. Preferably, as taught in the Dalal et al application, the metallurgy comprises tantalum 40, chrome 41 and aluminum 42. The term aluminum also includes a copper-doped aluminum and copper-doped aluminum-silicon. Although this is the best metallurgical system known to us at the present time, our invention does not preclude the use of other metallurgical systems.

We believe that the thrust of our invention lies in the fact that at no time is a hardened photoresist layer applied atop the platinum silicide contacts 32. Thus, we have avoided the problem of removal of the contaminants associated with stripping a tough resist layer atop the platinum.

In addition, because the oxide layer 24 disposed over LSB diode region 16 can be removed by dip etching, there is no need for another mask to protect the other openings in the substrate containing platinum silicide when layer 24 is removed (FIG. 4). This eliminates a masking step as compared to conventional metallization techniques.

While our invention has been particularly shown and described with reference to preferred embodiments thereof, it will be understood by those skilled in the art that the foregoing and other changes in form and detail may be made without departing from the spirit and scope of out invention. For example, although the preferred embodiment has been described in terms of particular metallurgical systems, other such systems could also be used within the purview of our invention. As previously noted, our invention is also applicable to processes requiring more than two metallurgical systems. For example, certain complex circuits might require three separate sets of metallurgical layers.

Having thus described our invention what we claim as new and desire to secure by Letters Patent is:

1. A method for selectively forming conductive contacts to impurity regions of a semiconductor substrate through a set of openings in a mask disposed atop said substrate comprising:

forming a protective layer of silicon dioxide within said set of openings;

removing said protective layer from a first subset of said openings while protecting a second subset of said openings, so as to expose a first subset of impurity regions;

depositing a first metallic silicide conductive contact material in said first subset of exposed impurity regions;

removing said protective layer by dip etching from said second subset of openings so as to expose a second subset of impurity regions without applying a resist layer atop said first contact material; and depositing a second conductive contact material in said first and second subsets of impurity regions.

2. A method as in claim 1 wherein said second subset of openings comprises all openings except said first subset of openings.

3. A method as in claim 1 wherein said mask comprises a composite of silicon dioxide and silicon nitride.

4. A method as in claim 1 wherein said first subset of impurity regions include N− type and N+ type silicon.

5. A method as in claim 4 wherein said contacts in said first subset of openings comprise both ohmic as well as high barrier height Schottky barrier contacts.

6. A method as in claim 1 wherein said second subset of impurity regions include N− type silicon.

7. A method as in claim 7 wherein said contacts in said second subset of openings comprise Schottky barrier diodes having low barrier heights.

8. A method as in claim 1 wherein said silicon dioxide is selected from the group consisting of thermally grown silicon dioxide and vapor deposited silicon dioxide.

9. A method as in claim 1 wherein said first conductive contact material is platinum silicide.

10. A method as in claim 9 wherein said second conductive contact material is tantalum.

* * * * *

UNITED STATES PATENT AND TRADEMARK OFFICE
CERTIFICATE OF CORRECTION

PATENT NO. : 4,233,337

DATED : November 11, 1980

INVENTOR(S) : Jules D. Friedman et al.

It is certified that error appears in the above-identified patent and that said Letters Patent are hereby corrected as shown below:

| | |
|---|---|
| Column 1, lines 8 and 9 | Delete ", now U.S. Pat. No. 4,155,778" |
| Column 1, line 12 | After "Dec. 30, 1977" insert --, now U.S. Pat. No. 4,155,778--. |
| Column 1, line 31 | "No. 3,995,310" should read --3,995,301--. |
| Column 1, line 65 | Before "systems" insert --contact--. |
| Column 6, line 58 | "A method as in claim 7" should read --A method as in claim 6--. |

Signed and Sealed this

Twenty-sixth Day of May 1981

[SEAL]

Attest:

RENE D. TEGTMEYER

*Attesting Officer*  *Acting Commissioner of Patents and Trademarks*